(12) United States Patent
Meiser et al.

(10) Patent No.: US 9,082,773 B2
(45) Date of Patent: Jul. 14, 2015

(54) INTEGRATED CIRCUIT, SEMICONDUCTOR DEVICE AND METHOD OF MANUFACTURING A SEMICONDUCTOR DEVICE

(71) Applicant: Infineon Technologies AG, Neubiberg (DE)

(72) Inventors: Andreas Meiser, Sauerlach (DE); Markus Zundel, Egmating (DE); Steffen Thiele, Munich (DE)

(73) Assignee: Infineon Technologies AG, Neubiberg (DE)

( * ) Notice: Subject to any disclaimer, the term of this patent is extended or adjusted under 35 U.S.C. 154(b) by 86 days.

(21) Appl. No.: 13/754,240

(22) Filed: Jan. 30, 2013

(65) Prior Publication Data
US 2014/0209905 A1    Jul. 31, 2014

(51) Int. Cl.
| | |
|---|---|
| *H01L 27/105* | (2006.01) |
| *H01L 23/544* | (2006.01) |
| *H01L 21/762* | (2006.01) |
| *H01L 27/088* | (2006.01) |
| *H01L 21/8234* | (2006.01) |

(52) U.S. Cl.
CPC ........ *H01L 23/544* (2013.01); *H01L 21/76224* (2013.01); *H01L 21/823481* (2013.01); *H01L 27/088* (2013.01); *H01L 2924/0002* (2013.01)

(58) Field of Classification Search
CPC ............ H01L 29/0626; H01L 29/0638; H01L 29/7393; H01L 29/7395; H01L 29/7815; H01L 27/105; H01L 27/108; H01L 27/1104; H01L 27/11803; H01L 27/823481
USPC .................. 257/331–337, 369, 392, E29.262
See application file for complete search history.

(56) References Cited

U.S. PATENT DOCUMENTS

| | | | | | |
|---|---|---|---|---|---|
| 5,563,431 | A | * | 10/1996 | Ohmi et al. | 257/291 |
| 5,679,973 | A | * | 10/1997 | Mochizuki et al. | 257/421 |
| 7,745,294 | B2 | * | 6/2010 | Pendharkar et al. | 438/286 |
| 7,800,171 | B2 | * | 9/2010 | Von Borcke et al. | 257/331 |
| 8,120,135 | B2 | * | 2/2012 | Krischke et al. | 257/467 |
| 8,796,057 | B2 | * | 8/2014 | Anderson et al. | 438/48 |
| 8,823,095 | B2 | * | 9/2014 | Lerner | 257/337 |
| 2005/0270869 | A1 | * | 12/2005 | Krischke et al. | 365/201 |
| 2007/0218579 | A1 | * | 9/2007 | Lee et al. | 438/48 |
| 2008/0088335 | A1 | * | 4/2008 | Blanchet et al. | 324/765 |
| 2008/0112214 | A1 | * | 5/2008 | Chung et al. | 365/158 |
| 2010/0207206 | A1 | * | 8/2010 | Krischke et al. | 257/337 |
| 2011/0188329 | A1 | * | 8/2011 | Kawahara et al. | 365/189.16 |

(Continued)

OTHER PUBLICATIONS

Andreas Meiser et al. "Method for Producing a Controllable Semiconductor Component." U.S. Appl. No. 13/614,076, filed Sep. 13, 2012.

*Primary Examiner* — Michael Lebentritt
(74) *Attorney, Agent, or Firm* — Murphy, Bilak & Homiller, PLLC

(57) ABSTRACT

An integrated circuit including a semiconductor device has a power component including a plurality of trenches in a cell array, the plurality of trenches running in a first direction, and a sensor component integrated into the cell array of the power component and including a sensor cell having an area which is smaller than an area of the cell array of the power component. The integrated circuit further includes isolation trenches disposed between the sensor component and the power component, an insulating material being disposed in the isolation trenches. The isolation trenches run in a second direction that is different from the first direction.

21 Claims, 13 Drawing Sheets

(56) References Cited

U.S. PATENT DOCUMENTS

2011/0215414 A1* 9/2011 Osada et al. ............... 257/369
2012/0037967 A1* 2/2012 Adkisson et al. ............ 257/292
2012/0126318 A1   5/2012 Kadow et al.
2012/0280357 A1* 11/2012 Wang et al. ............... 257/522
2013/0168809 A1* 7/2013 Yen et al. .................. 257/531

* cited by examiner

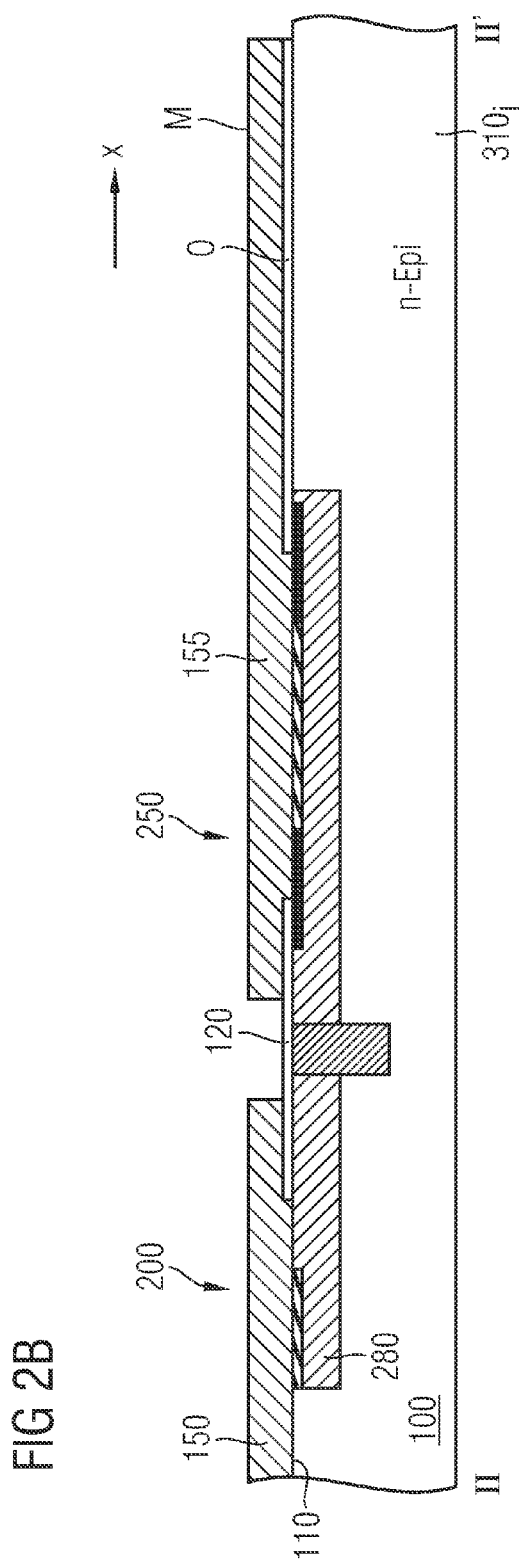

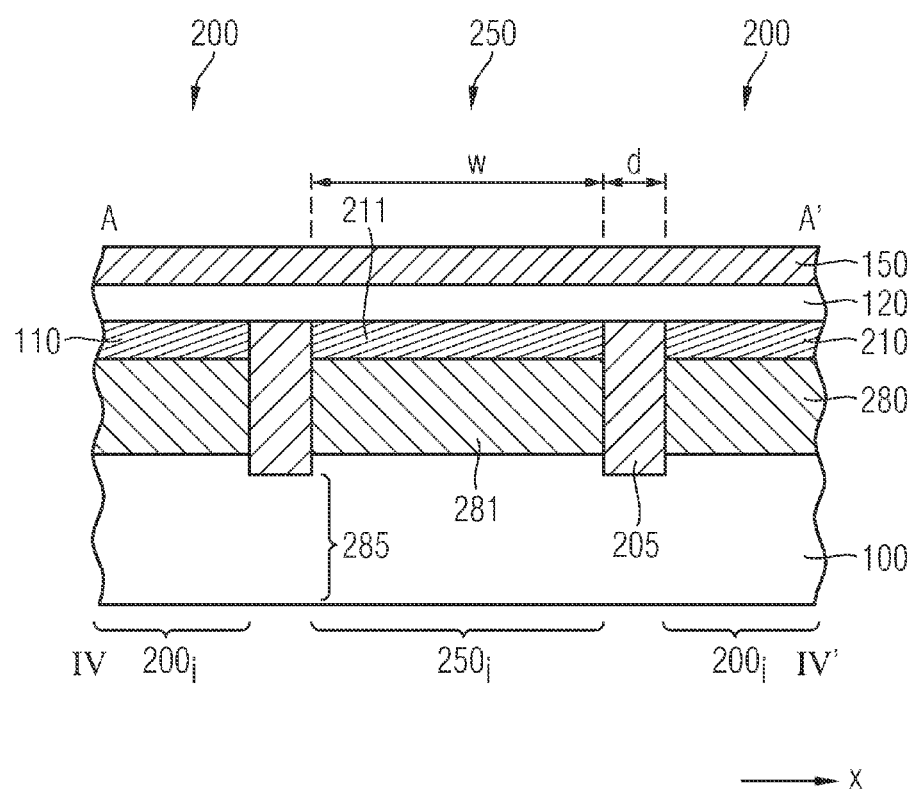

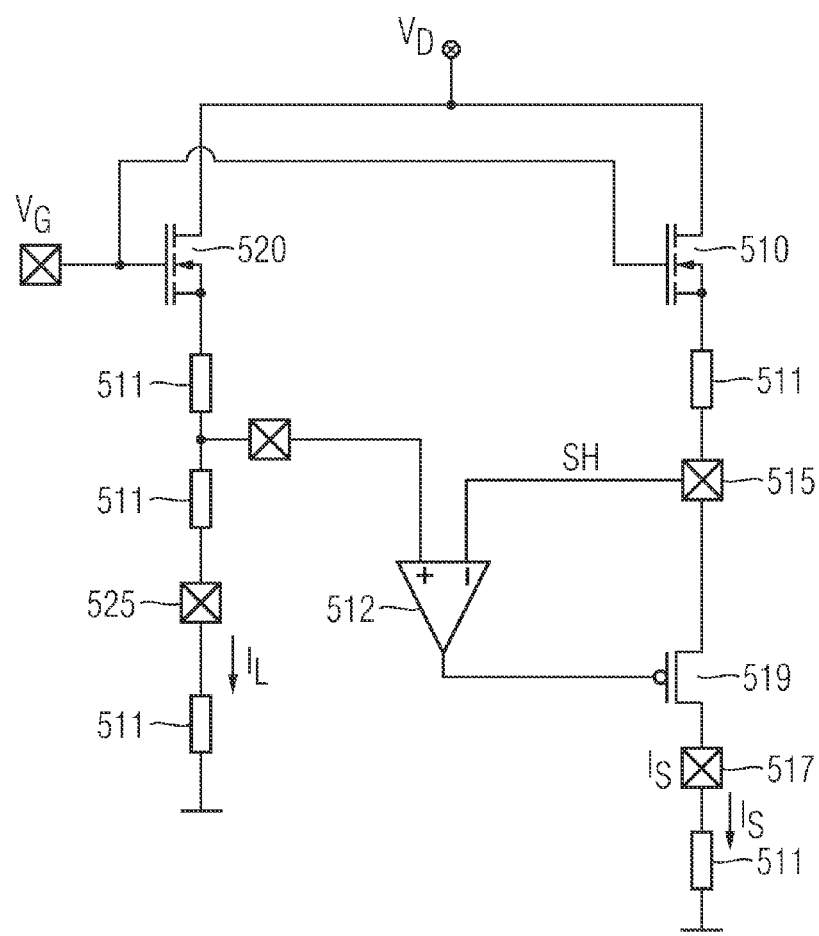

US 9,082,773 B2

INTEGRATED CIRCUIT, SEMICONDUCTOR DEVICE AND METHOD OF MANUFACTURING A SEMICONDUCTOR DEVICE

BACKGROUND

MOS power devices, for example, MOS power switches, comprising sensor transistors are commonly employed. For example, the sensor transistor may be used as a current sensor that is integrated with the power device. The current sensor may be used for measuring a load current of the power transistor. For example, in case of a short-circuit, the current sensor may sense a high current and may switch-off the power transistor, in order to avoid negative effects on the power transistor. Thereby, a self-protecting power device may be implemented.

Attempts are made to further improve the characteristics of such a device.

SUMMARY

According to an embodiment, an integrated circuit including a semiconductor device comprises a power component, including a plurality of trenches in a cell array, the plurality of trenches running in a first direction, and a sensor component integrated into the cell array of the power component and including a sensor cell having an area which is smaller than an area of the cell array of the power component. The integrated circuit further comprises isolation trenches disposed between the sensor component and the power component, an insulating material being disposed in the isolation trenches, the isolation trenches running in a second direction different from the first direction.

According to an embodiment, a semiconductor device includes a transistor array comprising a plurality of first transistors and at least a second transistor, at least one first and one second transistor being disposed adjacent to each other. Each of the first and second transistors comprise a source region disposed adjacent to a first main surface of a semiconductor substrate, and a gate electrode disposed in a trench formed in the first main surface, the gate electrode of the first transistor and the gate electrode of the second transistor being connected to a common gate potential. The semiconductor device further comprises an isolation trench disposed between the source region of the first transistor and the source region of the second transistor, the source region of the first transistor being connected to a first source potential, the source region of the second transistor being connected to a second source potential, the first source potential being different from the second source potential.

According to an embodiment, a method of manufacturing a semiconductor device comprises: forming a plurality of parallel gate trenches in a first main surface of a semiconductor substrate, a substrate portion between adjacent gate trenches defining a mesa, the gate trenches running in a first direction; forming first and second transistors in the mesa; forming an isolation trench between one of the first transistors and one of the second transistors, the isolation trench running in a second direction different from the first direction; and forming at least one insulating material in the isolation trench.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 2B shows a cross-sectional view of the integrated circuit shown in FIG. 1 along a direction of a mesa;

FIG. 3C shows a cross-sectional view of a portion of the integrated circuit between IV and IV' indicated in FIG. 3A;

DETAILED DESCRIPTION

Figure 1:
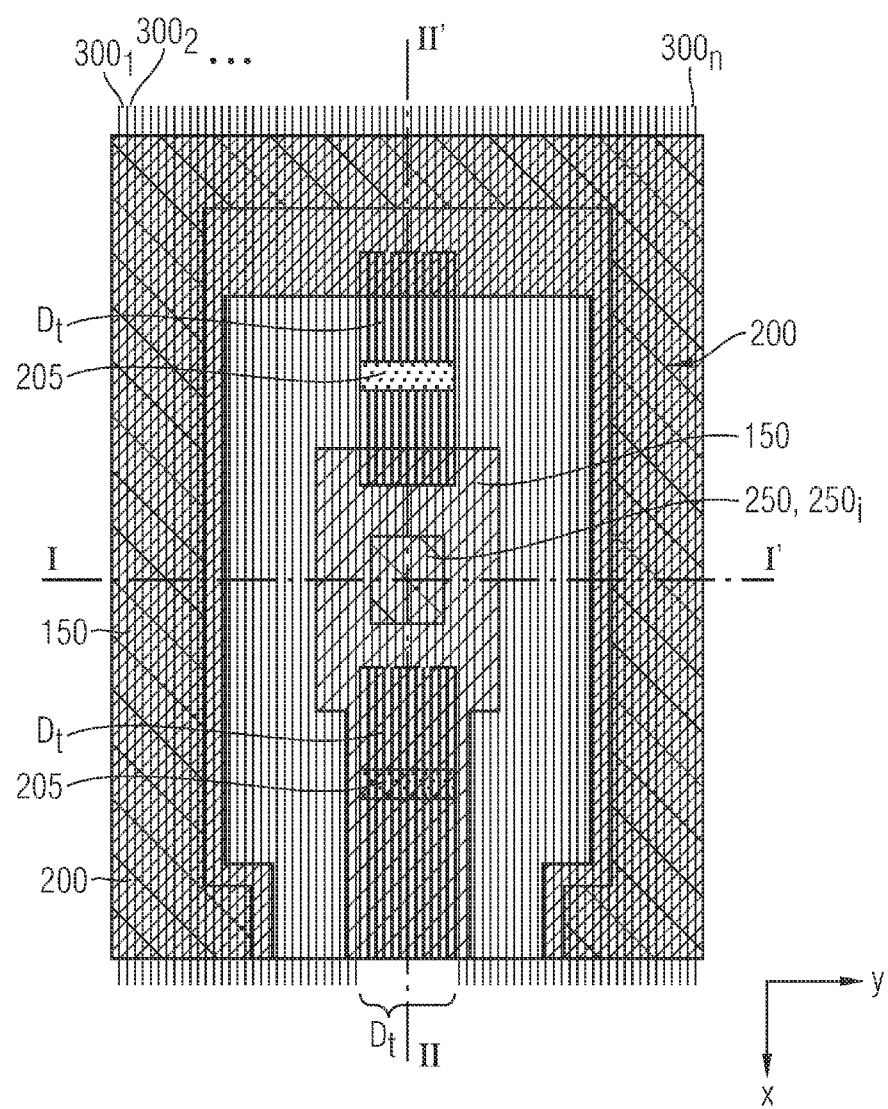
FIG. 1 schematically illustrates a plan view of an embodiment of integrated circuit including a power component and a sensor component.

In the following detailed description reference is made to the accompanying drawings, which form a part hereof and in which is illustrated by way of illustration specific embodiments in which the invention may be practiced. In this regard, directional terminology such as "top", "bottom", "front", "back", "leading", "trailing", etc., is used with reference to the orientation of the Figures being described. Since components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The Figures and the description illustrate relative doping concentrations by indicating "−" or "+" next to the doping type "n" or "p". For example, "$n^-$" means a doping concentration which is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

Generally, for patterning material layers, a photolithographic method may be used in which a suitable photoresist material is provided. The photoresist material is photolithographically patterned using a suitable photomask. The patterned photoresist layer can be used as a mask during subsequent processing steps. For example, as is common, a hardmask layer or a layer made of a suitable material such as silicon nitride, polysilicon or carbon may be provided over the material layer to be patterned. The hardmask layer is photolithographically patterned using an etching process, for example. Taking the patterned hardmask layer as an etching mask, the material layer is patterned.

FIG. 1 illustrates a schematic layout of an integrated circuit according to an embodiment. The integrated circuit of FIG. 1 comprises a power component 200 and a sensor component 250. The power component comprises a plurality of power transistor cells that are connected parallel to each other. The power component includes a plurality of trenches $300_1 \ldots 300_n$ that may be arranged so as to run parallel and at the same distance to each other in the x direction, i.e. the direction from top to bottom of the drawings. The integrated circuit further comprises a sensor component 250 which is integrated into the cell array of the power component. The sensor component 250 may comprise one or more sensor transistor cells or a sensor transistor cell array. An area of the sensor transistor cell array 250 is smaller than an area of the cell array of power component 200. The thick oxide trenches D, serve for insulating the sensor transistor $250_i$ illustrated in the centre of FIG. 1 and likewise run in the x direction. Isolation trenches 205 are disposed between the sensor component and the power component. An insulating material is disposed in the isolation trenches 205. The isolation trenches 205 run in the y direction.

Figure 2A:
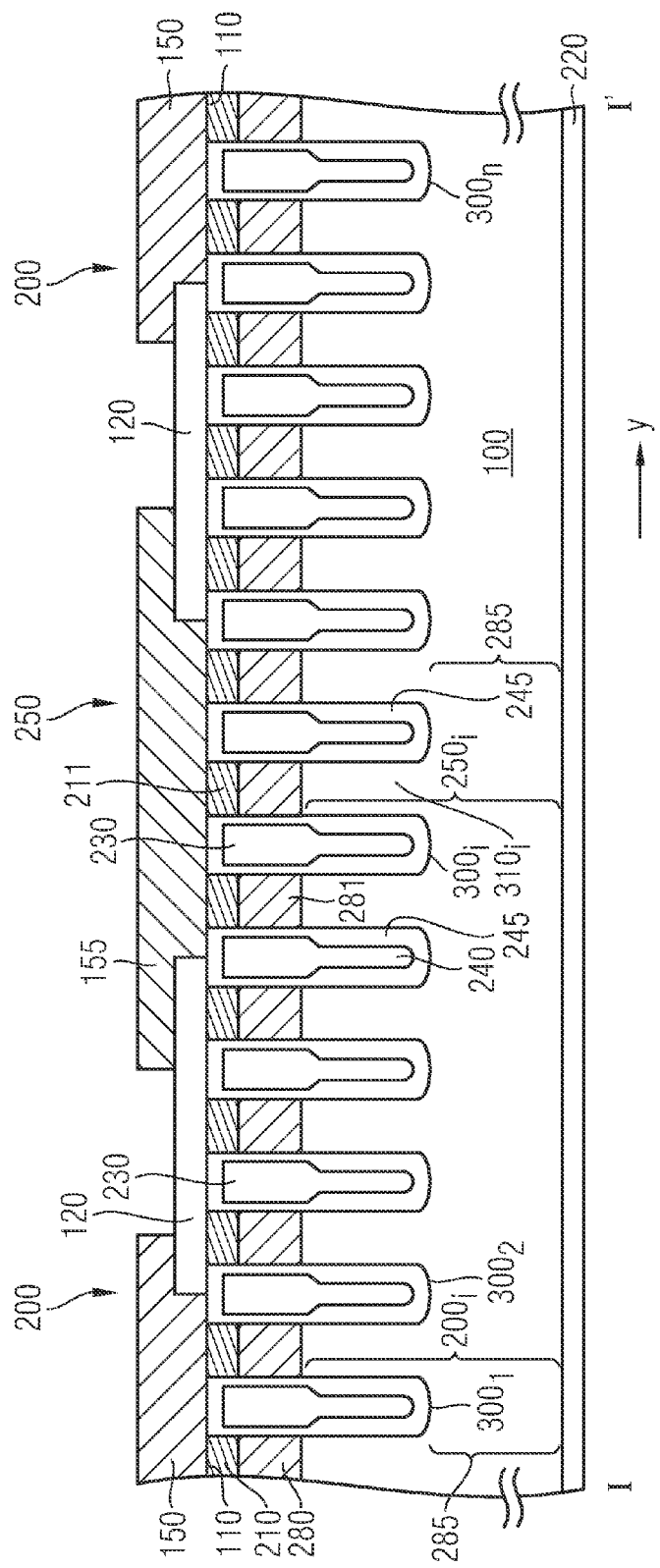
FIG. 2A shows a cross-sectional view of the device shown in FIG. 1 in a direction intersecting a plurality of gate electrode trenches.

FIG. 2A shows a cross-sectional view between I and I' illustrated in FIG. 1 along the y direction. FIG. 2A shows a semiconductor substrate 100 having a first main surface 110. A plurality of trenches is formed in the first main surface 110. The trenches $300_1, 300_2, \ldots 300_n$ run parallel and at the same distance. Gate electrodes 230 of the single power transistor cells $200_i$ and of the single sensor transistor cells $250_i$ are arranged in each of the trenches 300. A source region 210 of a power transistor $200_i$ and a source region 211 of a sensor transistor $250_i$ are disposed adjacent to the first main surface 110 of the substrate. A body region 280 of the power transistor $200_i$ and a body region 281 of the sensor transistor $250_i$ are arranged adjacent to the source regions 210, 211, respectively. A field plate 240 is arranged in a lower portion of each of the trenches 300. The field plate 240 is insulated from the adjacent substrate materials by means of the field dielectric layer 245. A drain region 220 of the transistors is disposed adjacent to a second main surface of the substrate, the second main surface being opposite to the first main surface 110. A drift region 285 is disposed between the body region 280 and the drain region 220.

When the power transistor $200_i$ is operated in an on-state and a corresponding gate voltage is applied to the gate electrode 230, an inversion channel is formed in the body region 280 to form a conductive channel. As a result, a current flows from the source region 210 to the drain region 220 via the conductive channel and the drift region 285.

When the power transistor is operated in an off-state and a corresponding gate voltage is applied to the gate electrode 230, no conductive channel is formed in the body region. Further, due to the presence of the field plate, carriers in the drift zone may be removed so that no current flows from the source to the drain region.

In the embodiment shown in FIG. 2A, the power transistors or load transistors $200_i$ have the same structure and may comprise identical components as the sensor transistors $250_i$. According to this embodiment, the source regions 210 of the power transistors 200 are connected with each other by means of a first metallization layer 150. Moreover, the source regions 211 of the sensor transistors $250_i$ are connected by means of a sensor metallization layer 155. As is further illustrated in FIG. 2A, there is one common drain region 220 for the power component and the sensor component. When identical drain and gate voltages are applied to the power component and the sensor component, the current $I_S$ of the sensor component may be proportional to the current $I_L$ of the power component, and the ratio of the $I_S/I_L$ may be constant.

FIG. 2B shows a cross-sectional view of the device between II and II' as is illustrated in FIG. 1. In particular, the cross-sectional view is taken along a mesa $310_i$ that is disposed between adjacent trenches $300_p$, $300_{p+1}$. The components of the transistors are formed in the mesa $310_i$. The cross-sectional view of FIG. 2B extends along the x-direction. As is specifically shown in FIG. 2B, an isolation trench 205 is disposed between the power transistor $200_i$ and the sensor transistor $250_i$. The isolation trench 205 may be filled with an insulating material or may be filled with several layers so as to insulate adjacent transistors. For example, the isolation trench 205 may laterally insulate adjacent transistors. The lower side of the isolation trench 205 is disposed beneath a lower side of the body region 280.

Figure 3A:
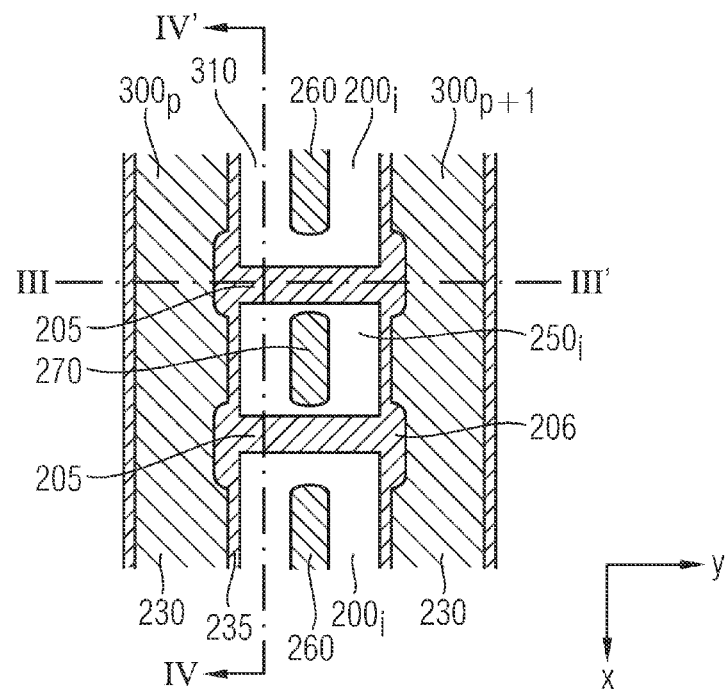
FIG. 3A shows a plan view of a portion of the integrated circuit.

FIG. 3A shows an enlarged view of an integrated circuit at a portion of a sensor transistor $250_i$ being disposed between two adjacent power transistors $200_i$ along the x-direction.

Two gate trenches $300_p$, $300_{p+1}$ are arranged parallel to each other, a mesa 310 being disposed between the two trenches $300_p$, $300_{p+1}$. A conductive material for forming the gate electrode 320 is disposed in each of the gate trenches. The gate electrode 230 is insulated from the mesa 310 by means of a gate dielectric 235, which may be silicon oxide as is conventional. As is illustrated in FIG. 3A, the mesa 310 is segmented by adjacent isolation trenches 205 that extend in the y-direction between two adjacent gate trenches $300_p$, $300_{p+1}$. At the position of the isolation trench 205, optionally a thicker field oxide 206 may be formed adjacent to the gate electrode 230. FIG. 3A further illustrates sense cell contacts 270 that are connected with the source portion of the sensor transistor 250. The array further comprises source contacts 260 that contact the source portion of each of the power transistors 200.

Figure 3B:
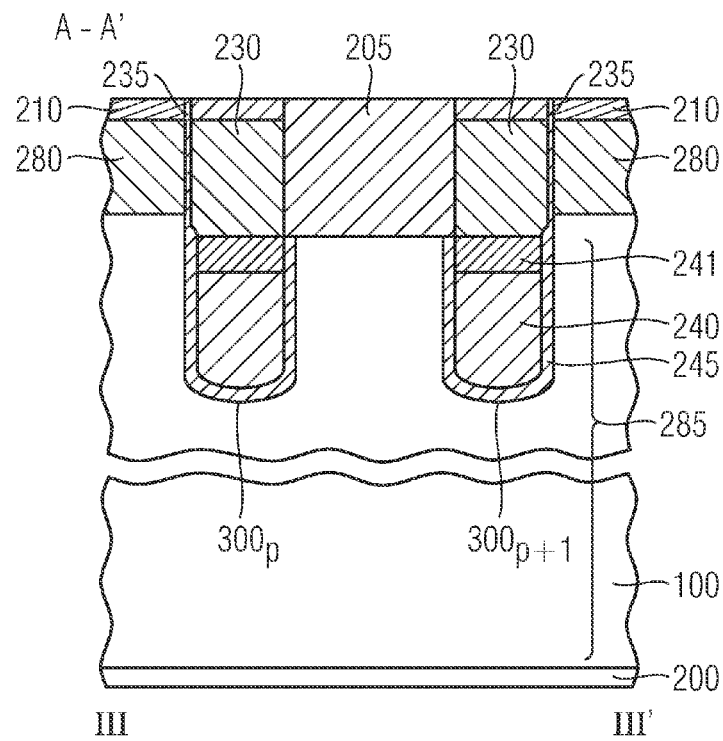
FIG. 3B shows a cross-sectional view between III and III' indicated in FIG. 3A.

FIG. 3B shows a cross-sectional view of the integrated circuit between III and III' as is also shown in FIG. 3A. The cross-sectional view of FIG. 3B is taken along the y-direction. FIG. 3B illustrates two adjacent gate trenches $300_p$, $300_{p+1}$. A field plate 240 is disposed in a lower portion of each of the trenches, the field plate 240 being insulated from the adjacent semiconductor material by means of the field dielectric layer 245. The field plate 240 may be connected with the gate electrode 230 or may be insulated from the gate electrode 230 by means of a dielectric layer 241. An isolation trench 205 runs in the y-direction between adjacent trenches $300_p$, $300_{p+1}$. A lower side of the isolation trench 205 extends at least to the position of the field plate 245 within the trenches 300. The lower portion of the isolation trench 205 is disposed beneath a lower side of the body region 280 that is disposed in a plane before or behind the depicted plane of the drawing. Further components of the transistor including the source region 210, the body region 285, the drift region 285 are disposed in the mesa 310 before or behind the depicted plane of the drawing.

FIG. 3C illustrates a cross-sectional view of the integrated circuit illustrated in FIG. 3A between IV and IV'. The cross-sectional view of FIG. 3C is taken along the x-direction. As is shown, the isolation trenches 205 are disposed between source regions 210, 211 and between body regions 280, 281 of a sensor transistor $250_i$ and adjacent power transistors $200_i$. As a consequence, the boundary of the body region 281 and the source region 211 of the sensor transistor $250_i$ is well defined and a thickness of the body region adjacent to the source region has a constant value. As a result, the electrical characteristics of the sensor transistor $250_i$ are well defined. Moreover, by setting the width of the isolation trenches 205 in the x-direction, the width W of the source regions 211 of the sensor transistor $250_i$, measured in the x-direction, can be set and the characteristics of the sensor transistor can be adjusted. According to an embodiment, the width of the source region may be determined by the width of the sense cell contact 270. By setting the width W of the source regions 211 of the sensor transistor $250_i$, it becomes possible to adjust the ratio $I_S/I_L$ of the sensor current and the load current of the power component more precisely. Further, due to the presence of the isolation trenches 205, the ratio $I_S/I_L$ is less susceptible to variations, for example, to variations during use.

Moreover, the isolation trenches 205 separate the body regions of the sensor transistor $250_i$ and the power transistor $200_i$. Hence, a parasitic bipolar transistor that could form between the sensor transistor $250_i$ and the power transistor $200_i$ can be better avoided. Further, effects that may be caused at edges of the power component may be avoided.

As is specifically illustrated in FIGS. 3A to 3C, a semiconductor device may include a transistor array, comprising a plurality of first transistors $200_i$ and at least a second transistor $250_i$. At least one first and one second transistor $200_i$, $250_i$ are disposed adjacent to each other. In the context of the present specification, the term "one first and one second transistor are disposed adjacent to each other" is intended to mean that further elements may be disposed between the first and the second transistors. Each of the first and second transistors $200i$, $250i$ comprises a source region 210, 211 the source region being disposed adjacent to a first main surface 110 of a semiconductor substrate 100, and a gate electrode 230 disposed in a trench $300_p$, $300_{p+1}$, formed in the first main surface 110, the gate electrode 230 of the first transistor $200_i$ and the gate electrode 230 of the second transistor $250_i$ being connected to a common gate potential. The semiconductor device further comprises an isolation trench 105 that is disposed between the source region 210 of the first transistor $200_i$ and the source region 211 of the second transistor $250_i$, the source region 210 of the first transistor $200_i$ being connected to a first source potential, the source region 211 of the second transistor $250_i$ being connected to a second source potential, the first source potential being different from the second source potential.

According to an embodiment, it is possible to integrate a plurality of sensor transistors $250i$, for example, by adding further sensor transistors $250_i$ along the x direction in the embodiment shown in FIG. 3A. According to this embodiment, these further sensor transistors may be arranged, with a further isolation trench 205 disposed between the single sensor transistors $250_i$. Moreover, as is also indicated in FIG. 2A, several sensor transistors $250_i$ may be arranged in parallel mesas so as to be adjacent to parallel gate trenches $300_i$.

Examples of the width of the gate trenches $300_i$ may be about 500 to 1000 nm, for example, 700 nm. An example of the depth of the gate trenches $300_i$ may be for example, 300 to 500 nm, for example 400 nm. The contacts 260 may have a width of approximately 200 to 400 nm, for example, 300 nm. The contacts 260 may be disposed in contact trenches that extend to a depth of approximately 300 to 500 nm, for example, 400 nm. Examples of the width of the isolation trenches 205 are approximately 400 to 600 nm, for example 500 nm. The isolation trenches extend to a depth between the contact trenches and the gate trenches $300i$. Examples of the depth of the isolation trenches are 1000 to 3000 nm, for example, 2000 nm.

According to an embodiment, the power transistor 200 is disposed immediately adjacent to the isolation trench 205, the isolation trench being immediately adjacent to the sensor transistor 250. According to a further embodiment, an additional element 400 may be disposed between the isolation trench 205 and the power transistor 200. Moreover, an additional isolation trench 205a may be disposed between the additional element 400 and the power transistor 200.

Figure 4:
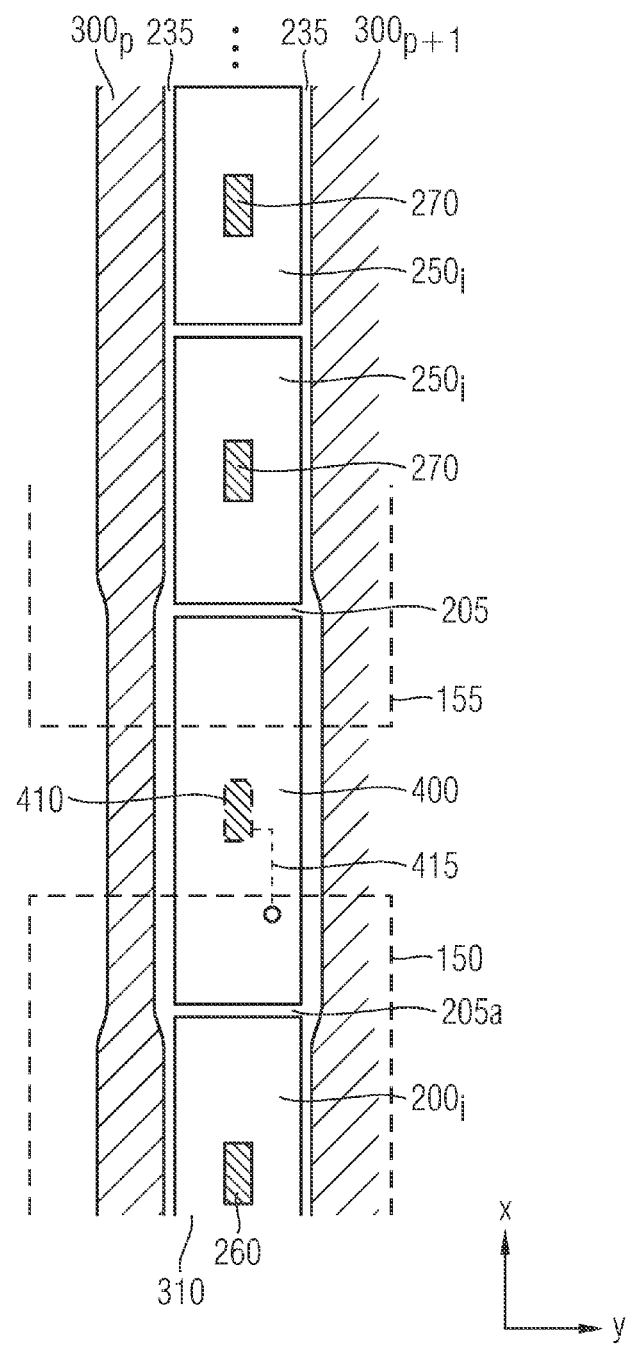
FIG. 4 shows a plan view of a portion of an integrated circuit according to a further embodiment.

FIG. 4 shows a plan view of a portion of an integrated circuit according to the embodiment. According to the embodiment shown in FIG. 4, an element 400 and an additional isolation trench 205a are disposed between a power transistor $200_i$ and a sensor transistor $250_i$. According to an example, the power transistor $200_i$ and the sensor transistor $250_i$ may be implemented as PMOS transistors. The element 400 may comprise a p-doped region and may, for example, be connected with the drain voltage of the power component. For example, the p doped region of the element 400 may be connected via a $p^+$ doped substrate portion and an epitaxial $p^-$ layer to the drain region 220. According to a further example, the element 400 may include an n-doped region corresponding to the body region 280 of the PMOS transistors. The n-doped region may be connected with the source potential of, e.g. the power transistor $200_i$. The broken lines of FIG. 4 illustrate a contact 410 to the n-doped region of element 400. The contact 410 is connected with the metallization layer 150 and, thus, the source potential of the power transistor $200_i$ via the interconnection 415. The integrated circuit further comprises a sensor metallization layer 155 that is connected with the sensor transistor $250_i$ by means of the sensor contact 270. The integrated circuit further comprises a metallization layer 150 that is connected with the source region of the load transistor $200_i$ by means of the source contact 260. A field oxide that is disposed between the element 400 and the gate electrode 230 may be thicker than a gate oxide layer that is adjacent to the sensor transistor $250_i$ or the load transistor $200_i$. Due to the presence of such an additional element 400, the power component and the sensor component may be contacted more easily, even when the typical pattern sizes are further shrunk.

Figure 5A:
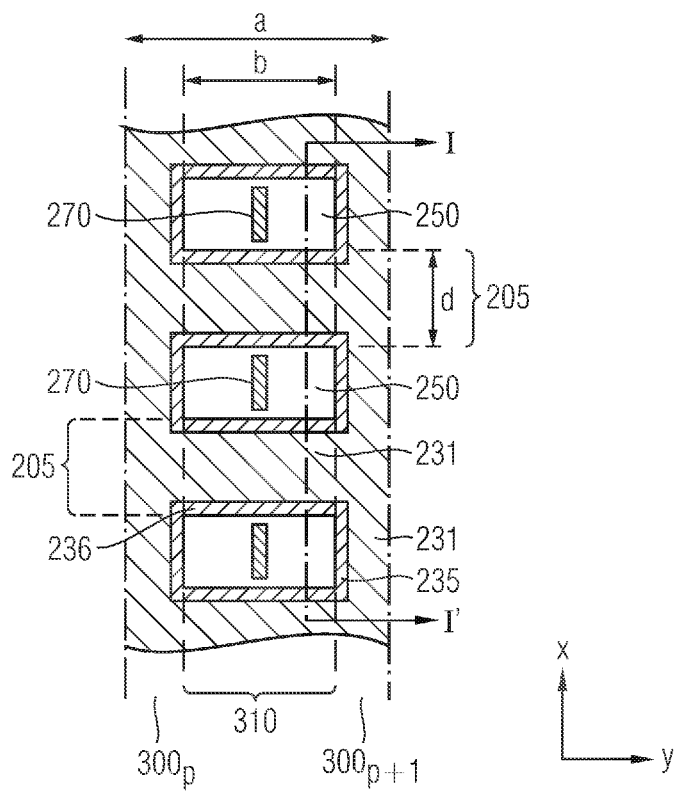
FIG. 5A shows a plan view of a portion of an integrated circuit according to a further embodiment.
Figure 5B:
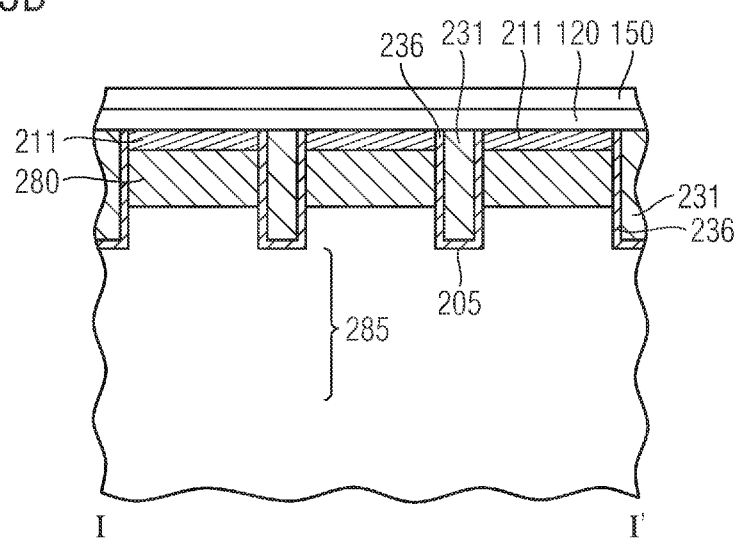
FIG. 5B shows an example of a cross-sectional view of a portion of the integrated circuit shown in FIG. 5A FIGS. 6A and 6B illustrate schematic circuit diagrams of an integrated circuit according to an embodiment.

FIG. 5A shows a plan view on an example of a further integrated circuit, and FIG. 5B shows a cross-sectional view between I and I' that is taken along the x-direction. According to the embodiment shown in FIG. 5A, a dielectric layer 236 is disposed adjacent to a sidewall of the isolation trenches 205. Further, a conductive layer 231, for example, a polysilicon layer is filled in the isolation trenches 205 to implement a conductive filling. The conductive filling 231 is connected with the gate electrode 230 and is held at a gate potential. Accordingly, the isolation trenches formed between adjacent source regions 210 of adjacent transistors act as gate electrodes. Thereby, the effective width of the transistor may be increased. In FIG. 5A, "b" denotes a width of each of the mesas 310. Adjacent mesas 310 are separated by trenches 300, the trenches 300 being filled with a conductive material for forming the gate electrode, the gate electrode being insulated from the semiconductor material by the gate dielectric 235. The pitch of the gate trenches is denoted by "a", and "d" denotes the width of each of the isolation trenches 205.

FIG. 5B shows a cross-sectional view illustrating the internal structure of the isolation trenches 205. In the embodiment shown in FIGS. 5A and 5B several sensor transistors $250_i$ are arranged along the x-direction. As is to be clearly understood, the embodiment of FIGS. 5A and 5B may also be implemented so as to include only one sensor transistor $250_i$.

Figure 6B:
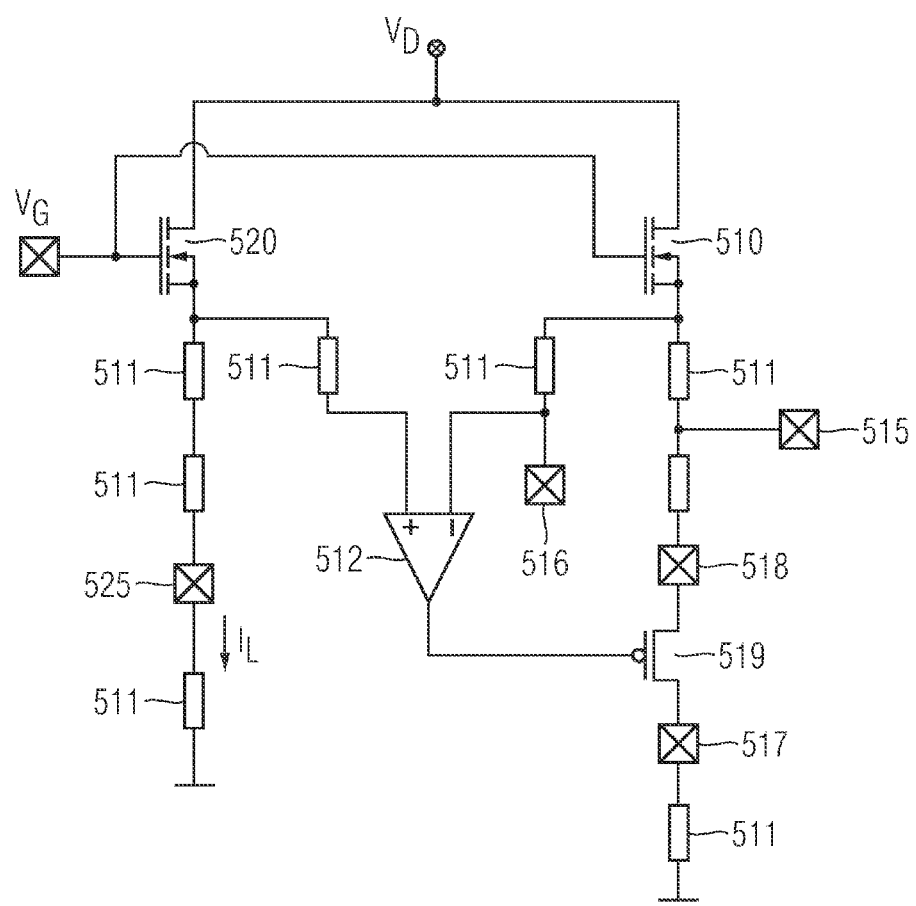

FIGS. 6A and 6B show examples of equivalent circuit diagrams including sense transistors 510 and load transistors 520. For example, the sense transistor 510 and the load transistor 520 may be implemented in a common-drain technology. As is shown in FIGS. 6A and 6B, the same drain potential $V_D$ is applied to the sense transistor 510 and the load transistor 520. Further, a common gate voltage $V_G$ is applied to the sense transistor 510 and the load transistor 520. The source potential of the load transistor 520 and the drain potential of the sense transistor 510 are fed to a differential amplifier 512. The correspondence of both source potentials has a big impact on the accuracy of the ratio between the current in the power transistor and the current in the sense transistor. According to the embodiment shown in FIG. 6A, if a voltage drop across the resistance 511 is high enough, the accuracy of the ratio between the current in the power transistor and the current in the sense transistor is shot down. According to FIG. 6B, as a countermeasure, a sense line without noticeable current leads from source to amplifier 512. Thereby, the source potential of the power transistor will more precisely correspond to the source potential of the sense transistor.

FIGS. 7A to 7F illustrate an example of a method for manufacturing an integrated circuit according to an embodiment. Starting point is a semiconductor substrate 600 having a first main surface 610 and a second main surface 620, the second main surface 620 being opposite to the first main surface 610. For example, the semiconductor substrate 600 may be doped with a first conductivity type and further doped portions 633, 634, 635 may be formed in the semiconductor substrate. For example, the layer 630 may be n$^+$-doped, the layer 633 may be n$^-$-doped, the layer 634 may be p-doped and the layer 635 may be n$^+$-doped. As is clearly to be understood, any of these conductivity types may be reversed. A hard mask layer 640 is formed on the first main surface of the semiconductor substrate 610, followed by a photoresist layer 641. According to an embodiment, the structure shown in FIGS. 3A to 3C including several trenches or contact openings having different widths may be formed using one single mask including openings of different widths. Due to the different width of each of the openings, an etching rate in each of these openings is different, thus resulting in the formation of openings in the semiconductor substrate surface, each having a different depth.

Figure 7A:
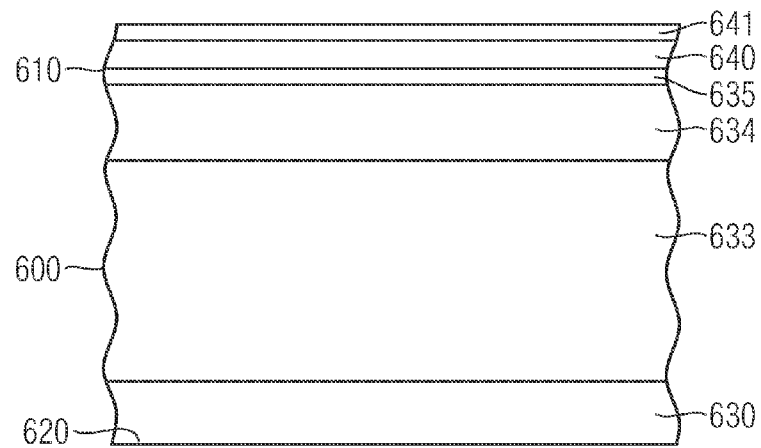
FIGS. 7A to 7F schematically illustrate a method for manufacturing an integrated circuit.
Figure 7B:
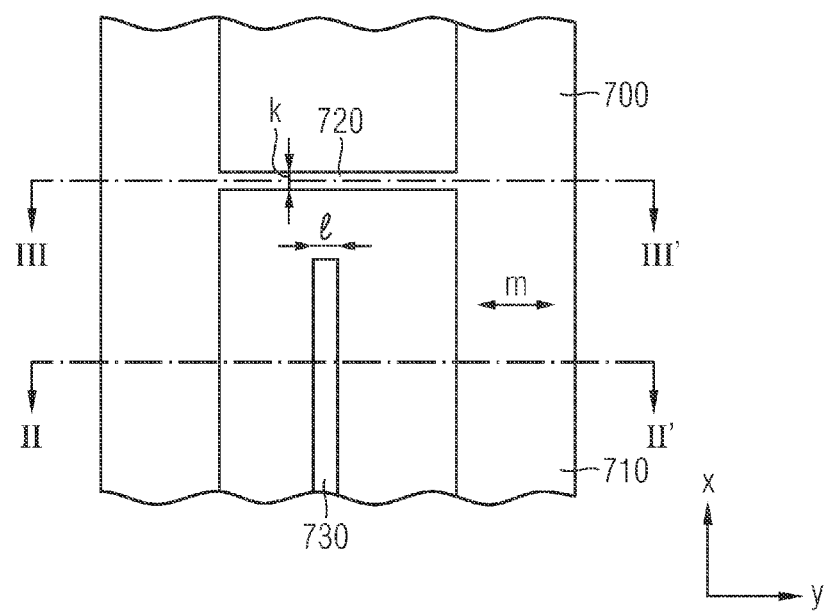

FIG. 7B illustrates an example of a mask 700. The mask 700 includes trench openings 710 having a width m. The mask further comprises contact openings 730 having a width l, the contact openings 730 and the trench openings 710 extending in the x-direction. The mask 700 further comprises isolation trench openings 720 extending in the y-direction. The isolation trench openings 720 have a width k.

The semiconductor substrate shown in FIG. 7A may be patterned by photolithographically patterning the photoresist layer 641 using the mask shown in FIG. 7B. Thereafter, the hard mask layer 640 is etched using the patterned photoresist mask as an etching mask. Then, the substrate material 600 is etched using the mask formed in the hard mask layer 640.

Figure 7C:
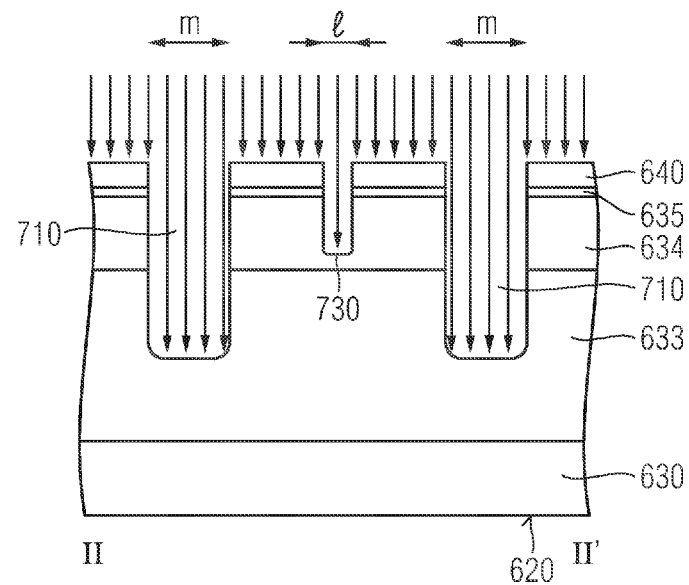

FIG. 7C shows a cross-sectional view of the substrate at a position corresponding to the position II to II' of the mask illustrated in FIG. 7B. Etching is performed using the patterned hard mask layer 640 as an etching mask. As is shown, in a region of the trench openings 710, the substrate material 600 is etched as a high etching rate, due to the opening width m. Further, in a region of the contact trench openings 730, due to the decreased width l of these contact trench openings 730, the etching rate is smaller, resulting in a contact trench having a smaller depth and a smaller width than the gate trenches. After etching the substrate material and removing the remaining portions of the photoresist layer and the hard mask layer 640, an oxide layer 650 is formed over the substrate surface 610. The oxide layer 650 may completely fill the trenches formed at the position of the contact trench openings 730 and may form a conformal layer in the trenches formed at the position of the trench openings 710.

Figure 7D:
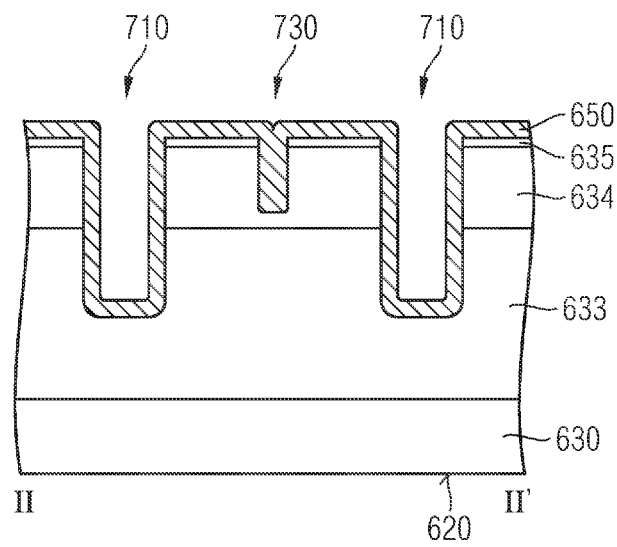
Figure 7E:
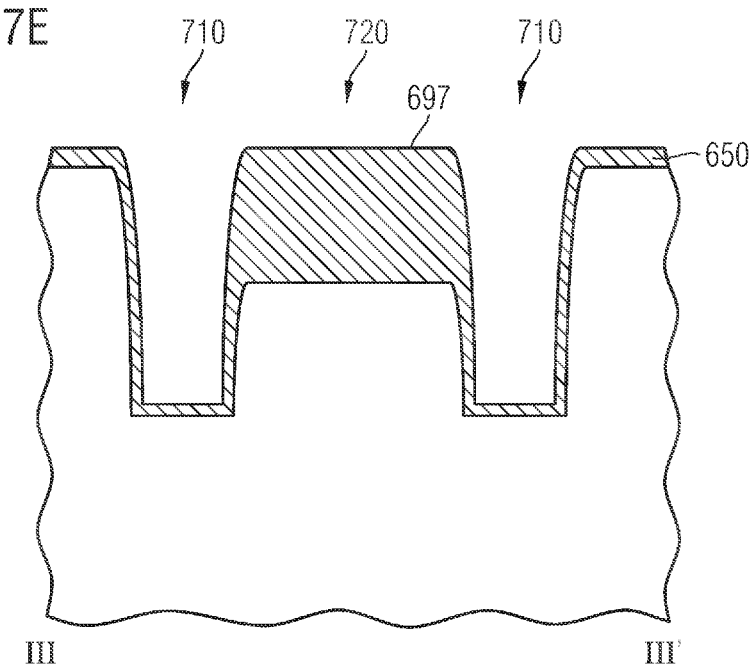

FIG. 7D shows an example of a resulting structure. FIG. 7E shows an example of a resulting structure between III and III' using the mask shown in FIG. 7B. Due to the small width of the isolation trench opening 720 in the x-direction, i.e. perpendicularly to the cross-sectional view shown in FIG. 7E, the etching rate at the position of the isolation trench openings 720 is much smaller than at the position of the trench openings 710. Then, an oxide layer 650 is formed so as to implement the insulating filling of the isolation trenches and in order to implement the insulating layer disposed at a sidewall of the gate trenches 710.

Figure 7F:
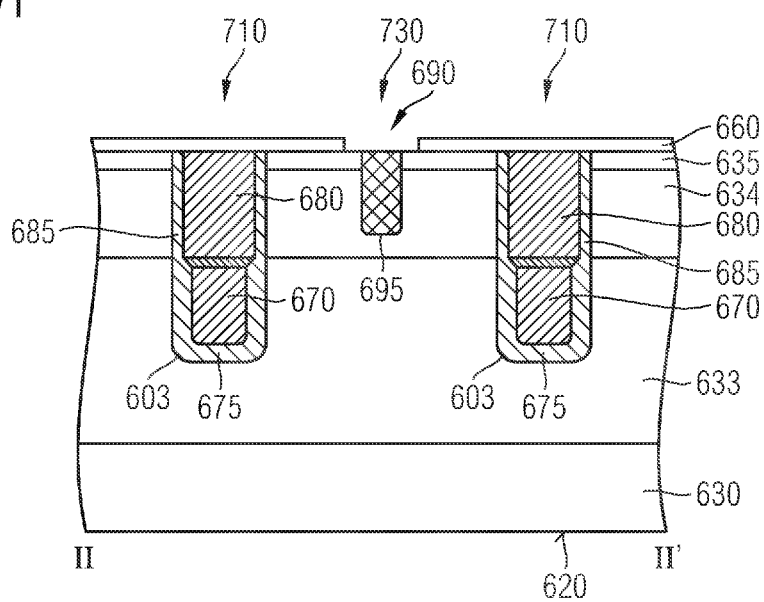

In a next step, the substrate may be further processed, for example, by forming a conductive material for forming the field plate 670 in the gate trenches, followed by a gate dielectric 685 and a gate electrode 680. Thereafter, the gate trenches 603 may be covered by an insulating layer 660. In a next step, the insulating layer 660 may be opened to form a contact opening 690 at the position of the contact trenches 730. Then, the insulating material 650 filled in the gate contact trench may be removed, and a conductive material 695 may be filled in the contact trench in order to provide an electrical contact. FIG. 7F shows an example of a resulting structure. In the following, further processing steps may be performed, in order to form further components of the integrated circuit.

As has been explained referring to FIGS. 7A to 7F, joint etching processes using a single photomask may be performed. Accordingly, the method of manufacturing an integrated circuit may be further simplified, and components of the integrated circuit may be processed in a self-aligned manner.

Figure 8:
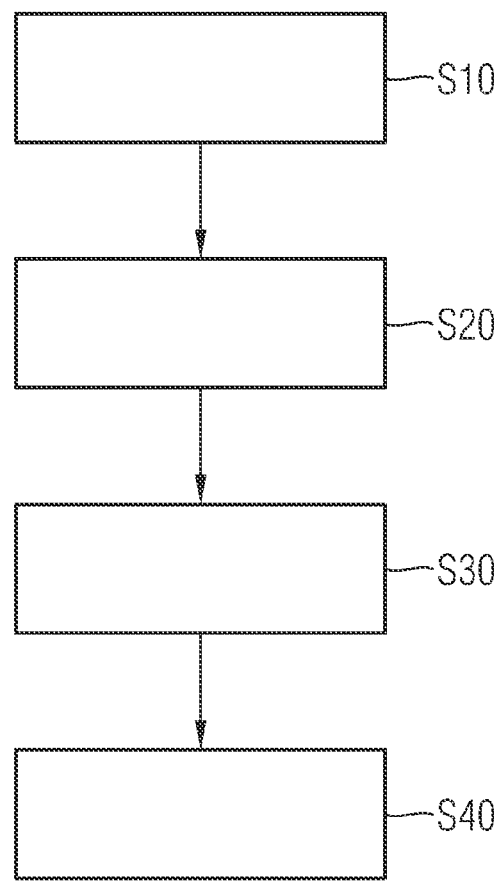
FIG. 8 schematically illustrates a method for manufacturing an integrated circuit.

FIG. 8 schematically illustrates a method of manufacturing a semiconductor device. As is shown, the method comprises: forming a plurality of parallel gate trenches in a first main surface of a semiconductor substrate (S10), a substrate portion between adjacent gate trenches defining a mesa, the gate trenches running in a first direction; forming first and second transistors in the mesa (S20); forming an isolation trench between one of the first transistors and one of the second transistors (S30), the isolation trench running in a second direction, being different from the first direction; and forming at least one insulating material in the isolation trench (S40).

According to an embodiment, the gate trenches and the isolation trench are defined using a single photomask. Further, the gate trenches and the isolation trench may be formed by a joint etching process.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. An integrated circuit including a semiconductor device, comprising:
   a power component comprising a plurality of trenches in a cell array, the plurality of trenches running in a first direction;
   a sensor component integrated into the cell array of the power component and including a sensor cell having an area which is smaller than an area of the cell array of the power component; and
   an isolation trench running in a second direction different from the first direction, an insulating material being disposed in the isolation trench, the isolation trench being disposed between the sensor component and the power component along the first direction.

2. The integrated circuit according to claim 1, wherein the power component comprises a power transistor including a source region, a drain region, a body region and a gate electrode, the gate electrode being adjacent to the body region, and
   the sensor cell comprises a sensor transistor including a source region, a drain region, a body region and a gate electrode, the body region and the source region of the power transistor being laterally insulated from the body region and the source region of the sensor transistor by an isolation trench.

3. The integrated circuit according to claim 2, wherein the source regions of the power transistor and of the sensor transistor are disposed adjacent to a first main surface of a semiconductor substrate, and the isolation trenches are disposed adjacent to the first main surface.

4. The integrated circuit according to claim 2, wherein the gate electrode of the power transistor and the gate electrode of the sensor transistor are disposed in one of the plurality of trenches and are connected with each other to form a common gate electrode.

5. The integrated circuit according to claim 2, wherein the plurality of trenches run parallel to one another in a same direction and a region between adjacent trenches defines a mesa region, a plurality of the mesa regions running parallel to one another in the direction of the plurality of trenches, the source region and the body region of each of the power transistors and the sensor transistors being disposed in the mesa regions.

6. The integrated circuit according to claim 5, wherein the isolation trenches intersect at least one of the mesa regions.

7. The integrated circuit according to claim 6, wherein the isolation trenches extend to a depth beneath a lower side of the body regions.

8. The integrated circuit according to claim 2, wherein two isolation trenches are adjacent to one source portion of the sensor transistor.

9. The integrated circuit according to claim 8, wherein a width of the sensor transistor is configured to be adjusted by setting a distance between adjacent isolation trenches.

10. The integrated circuit according to claim 2, wherein the drain region of the power transistor and the drain region of the sensor transistor are connected to a drain potential, and the gate electrode of the power transistor and the gate electrode of the sensor transistor are connected to a gate potential.

11. The integrated circuit according to claim 4, further comprising a conductive material disposed in the isolation trenches and connected with the common gate electrode.

12. The integrated circuit according to claim 1, wherein the integrated circuit is configured to operate as a power switch.

13. The integrated circuit according to claim 1, further comprising a doped region disposed between the isolation trench and the power component.

14. The integrated circuit according to claim 13, further comprising an additional isolation trench disposed between the doped region and the power component.

15. A semiconductor device including a transistor array, comprising a plurality of first transistors and at least a second transistor, at least one first and one second transistor being disposed adjacent to each other, each of the first and second transistors comprising:
   a source region disposed adjacent to a first main surface of a semiconductor substrate; and
   a gate electrode disposed in a trench formed in the first main surface, the gate electrode of the first transistor and the gate electrode of the second transistor being connected to a common gate potential;
   the semiconductor device further comprising an isolation trench disposed between the source region of the first transistor and the source region of the second transistor along the first direction, the source region of the first transistor being connected to a first source potential, the source region of the second transistor being connected to a second source potential, the first source potential being different from the second source potential.

16. The semiconductor device according to claim 15, wherein each of the first and second transistors further comprises a drain region adjacent to a second main surface of the semiconductor substrate, the second main surface being opposed to the first main surface, the drain region of the first transistor and the drain region of the second transistor being connected to a common drain potential.

17. The semiconductor device according to claim 15, wherein the source region is disposed in a mesa defined by parallel gate trenches, wherein the first and the second transistors further comprise a body region disposed in the mesa beneath each of the source regions and a conductive material disposed in the gate trenches forming the gate electrode of the first and second transistors.

18. The semiconductor device according to claim 15, wherein the semiconductor device is configured to operate as a power switch.

19. The semiconductor device according to claim 15, wherein the first transistor is operable as a power transistor and the second transistor is operable as a sensor transistor.

20. The semiconductor device according to claim 15, further comprising a doped region disposed between the isolation trench and the first transistor.

21. The semiconductor device according to claim 15, further comprising an additional isolation trench disposed between the doped region and the first transistor.

* * * * *